United States Patent
Ohta et al.

(10) Patent No.: US 7,070,864 B2
(45) Date of Patent: Jul. 4, 2006

(54) LAMINATE FOR ELECTRONIC MATERIALS

(75) Inventors: Takuhei Ohta, Chiba (JP); Katsufumi Hiraishi, Chiba (JP); Taeko Takarabe, Chiba (JP); Syuji Takiyama, Chiba (JP); Eri Kabemura, Chiba (JP); Kazuya Miyamoto, Chiba (JP); Takashi Matsuda, Chiba (JP); Tazo Sawamura, Chiba (JP)

(73) Assignee: Nippon Steel Chemical Co., Ltd. (JP)

( * ) Notice: Subject to any disclaimer, the term of this patent is extended or adjusted under 35 U.S.C. 154(b) by 159 days.

(21) Appl. No.: 10/474,124

(22) PCT Filed: Apr. 19, 2002

(86) PCT No.: PCT/JP02/03919

§ 371 (c)(1),
(2), (4) Date: Oct. 6, 2003

(87) PCT Pub. No.: WO02/085616

PCT Pub. Date: Oct. 31, 2002

(65) Prior Publication Data

US 2004/0105989 A1 Jun. 3, 2004

(30) Foreign Application Priority Data

Apr. 19, 2001 (JP) ............................ 2001-121553

(51) Int. Cl.
*B32B 27/06* (2006.01)
*C08G 73/10* (2006.01)
*C08G 69/26* (2006.01)

(52) U.S. Cl. .................. 428/473.5; 528/353; 528/332; 528/350

(58) Field of Classification Search ............ 428/473.5, 428/474.4, 474.7, 458; 528/125, 126, 128, 528/170, 171, 172, 173, 174, 176, 183, 185, 528/188, 220, 229, 332, 250, 322
See application file for complete search history.

(56) References Cited

U.S. PATENT DOCUMENTS

| | | | | |
|---|---|---|---|---|
| 5,536,584 A | * | 7/1996 | Sotokawa et al. | 428/458 |
| 6,203,918 B1 | | 3/2001 | Shimose et al. | |
| 6,623,843 B1 | * | 9/2003 | Fujii et al. | 428/209 |

FOREIGN PATENT DOCUMENTS

| | | |
|---|---|---|
| JP | 60-243120 | 12/1985 |
| JP | 61-111181 | 5/1986 |
| JP | 61-143434 | 7/1986 |
| JP | 01-261421 | 10/1989 |
| JP | 03-164240 | 7/1991 |
| JP | 11-054862 | 2/1999 |
| JP | 2000-080272 | 3/2000 |
| JP | 2000-281671 | 10/2000 |

OTHER PUBLICATIONS

International Search Report for PCT/JP02/03919 mailed on Jul. 30, 2002.
International Preliminary Examination Report for PCT/JP02/03919 mailed on Jul. 1, 2003.

* cited by examiner

*Primary Examiner*—Thao T. Tran
(74) *Attorney, Agent, or Firm*—Rader, Fishman & Grauer PLLC

(57) ABSTRACT

This invention relates to a laminate which is excellent in heat resistance after moisture absorption required in a lead-free solder joint, and is suitable for use in flexible printed wiring boards or HDD suspensions. The laminate for electronic materials of this invention is constituted of a conductor layer and an insulating resin layer having a polyimide-based resin layer (A) and a polyimide-based resin layer (B). The polyimide-based resin layer (A) constituting the insulating layer includes a polyimide-based resin obtained by reacting a diamine containing 40 mol % or more of 4,4'-diamino-2,2'-dimethylbiphenyl with an aromatic tetracarboxylic acid, and the polyimide-based resin layer (B) includes a polyimide-based resin containing 80 mol % or more of a structural unit generated from bis(4-aminophenoxy)benzene or 2,2-bis[4-(4-aminophenoxy)phenyl]propane, and pyromellitic acid, benzophenonetetracarboxylic acid, diphenylsulfonetetracarboxylic acid or biphenyltetracarboxylic acid.

7 Claims, No Drawings

LAMINATE FOR ELECTRONIC MATERIALS

TECHNICAL FIELD

The present invention relates to a laminate used in flexible printed boards, HDD suspensions, or the like.

BACKGROUND ART

Heat resistance of a laminate for electronic materials used in flexible printed boards or HDD suspensions has been determined on the premise that a joint temperature at the time when a solder-joint is performed after formation of a circuit or the like is about 240° C. under an environment where a laminate is allowed to stand in a general atmosphere at room temperature and moisture and saturatedly absorbs moisture in air. This is because a melting point of a typical eutectic solder containing lead is 180° C., and a solder joint can be performed at a temperature between 200° C. and 250° C.

However, from the fact that lead is harmful, a lead-free solder has been developed and put into practical use. Because a melting point of a typical lead-free solder is 200–230° C., a joining temperature of 250° C. or higher is required in order to perform a sufficient solder joint. Therefore, a laminate having heat resistance against such a high joining temperature of a lead-free solder is desired.

It is known that a heat resistant polyimide resin is used as an insulating resin in a flexible printed board. Further, it is known as disclosed in JP 08-250860 A that a material containing plural polyimide resin layers is used for an insulating layer. However, the technology disclosed therein was not sufficient in its heat resistance for a lead-free solder joint.

Further, JP 03-164240 A describes that in a laminate used in flexible printed wiring boards or the like, a specific diamine such as tolidine is used as a diamine component constituting a polyimide resin in order to form a laminate that has an excellent adhesiveness between a metal foil and a film and is difficult to curl. However, the laminate described therein is composed of a polyimide single layer, and balance adjustment of various performances required in laminates is difficult in some cases. In addition, heat resistance in a lead-free solder joint is not taken into consideration at all.

DISCLOSURE OF THE INVENTION

An object of the present invention is to provide a laminate including a polyimide-based resin layer and a conductor layer, the polyimide-based resin layer having a chemical structure excellent in heat resistance, for coping with a rise in a solder joint temperature due to lead-free soldering.

A laminate according to the present invention includes a conductor layer and an insulating resin layer that is formed of plural polyimide-based resin layers, the insulating resin layer having at least two layers: a polyimide-based resin layer (A) obtained by reacting a diamino compound containing 40 mol % or more of 4,4'-diamino-2,2'-dimethylbiphenyl with a tetracarboxylic acid compound; and a polyimide-based resin layer (B) containing 80 mol % or more of a polyimide structural unit represented by the following general formula (1):

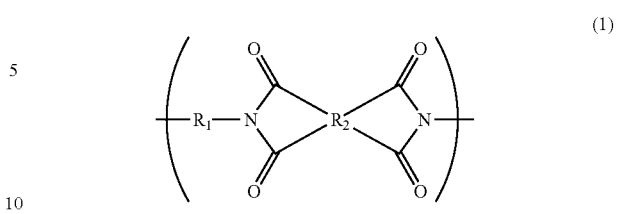

(In the formula, $R_1$ is a group represented by the following formula (2) or (3), and $R_2$ is a group represented by the following formula (4) or (5). Further, in the following formula (4), X shows $SO_2$, CO, or single bond).

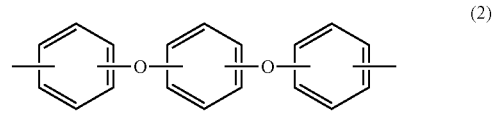

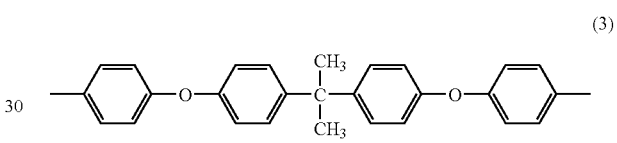

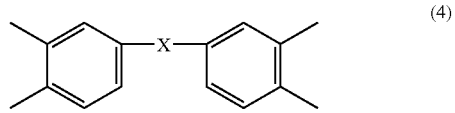

The present invention is described in detail below.

The laminate of the present invention has a conductor layer and an insulating resin layer formed of plural polyimide-based resin layers. The conductor layer may be a single layer or may have plural layers. The insulating resin layer includes plural polyimide-based layers, and has at least one polyimide-based resin layer (A) and at least one polyimide-based resin layer (B).

A polyimide-based resin A constituting the polyimide-based resin layer (A) is obtained by reacting a diamino compound containing 40 mol % or more of 4,4'-diamino-2,2'-dimethylbiphenyl (DADMB) with an aromatic tetracarboxylic acid compound.

The polyimide-based resin A is obtained by reacting a diamino compound containing 40 mol % or more, preferably 50 mol % or more, and particularly preferably 80 mol % or more, of DADMB with a tetracarboxylic acid compound. Preferably, it is a polyimide-based resin containing 40 mol % or more, more preferably 50 mol % or more, and most preferably 80 mol % or more, of either or both (when containing the both, the total thereof) of structural units represented by the following general formulae (6) and (7).

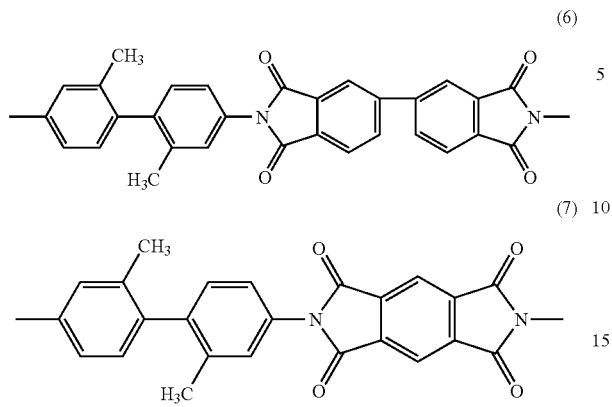

(6)

(7)

Note that, the polyimide-based resin is resin composed of polymers each having a structure with imide groups such as polyimide, polyamide imide, polyether imide, polyester imide, polysiloxane imide, and polybenzimidazole imide.

The polyimide-based resin A can be produced by the conventional method, except for using a diamino compound containing 40 mol % or more of DADMB as a diamino compound. For example, the resin is produced by two steps of synthesis of a polyamic acid which is a precursor of a polyimide-based resin in a solution, and an imidation reaction, using almost equimolar amounts of a tetracarboxylic acid compound and a diamino compound as raw materials.

An aromatic tetracarboxylic acid and its acid anhydride, an esterified product or halide, and the like are listed as the tetracarboxylic acid. The acid anhydride is preferable from ease of synthesis of a polyamic acid. There are no limitations on diamino compounds other than DADMB and tetracarboxylic acid compounds, but an aromatic diamine compound and an aromatic tetracarboxylic acid compound are desirable.

A compound represented by $NH_2$—Ar—$NH_2$ is suitably listed as a diamino compound other than DADMB. Here, Ar is selected from groups represented by the following formula (8), and a substitution position of an amino group is optional, but p,p'-positions are preferable. Ar can have a substituent, but preferably does not have any substituent, or has a lower alkyl or lower alkoxy group having 1–6 carbon atoms. Those aromatic diamino compounds may be used in one kind or two kinds or more.

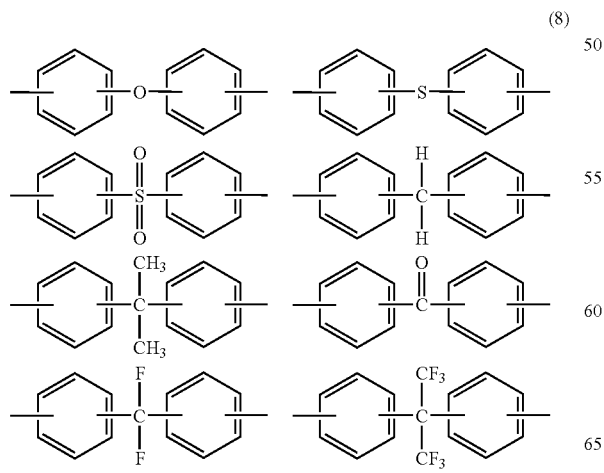

(8)

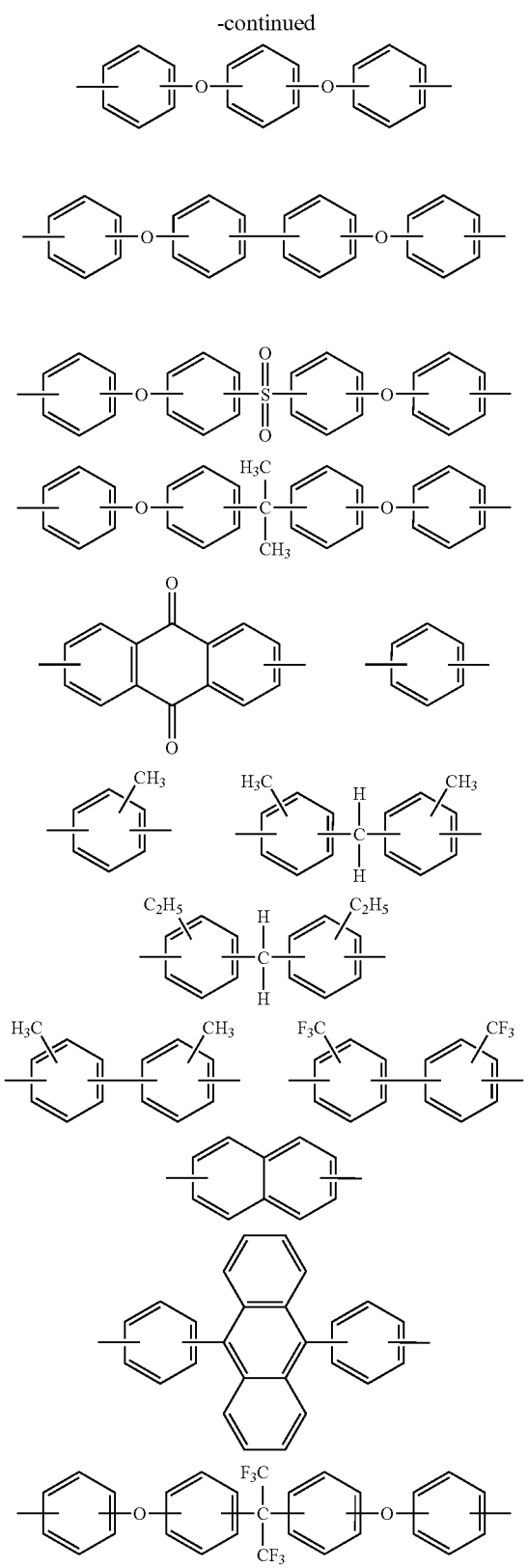

Further, a compound represented by $O(CO)_2Ar'(CO)_2O$ is suitably listed as the aromatic tetracarboxylic acid compound. Here, Ar' is preferably a tetravelent aromatic group represented by the following formulae (9). A substitution position of an acid anhydride group [(CO)₂O] is optional, but a symmetric position is preferable. Ar' can have a substituent, but preferably does not have any substituent, or has a lower alkyl group having 1–6 carbon atoms. A preferable aromatic tetracarboxylic acid compound is biphenyltetracarboxylic anhydride (BPDA), 4,4'-oxydiphthalic anhydride (ODPA), pyromellitic anhydride (PMDA) or combinations of those. A more preferable aromatic tetracarboxylic acid compound is BPDA, PMDA or both. It is advantageous for balance adjustment of various performances to use BPDA and PMDA in a molar ratio of 0:10–8:2.

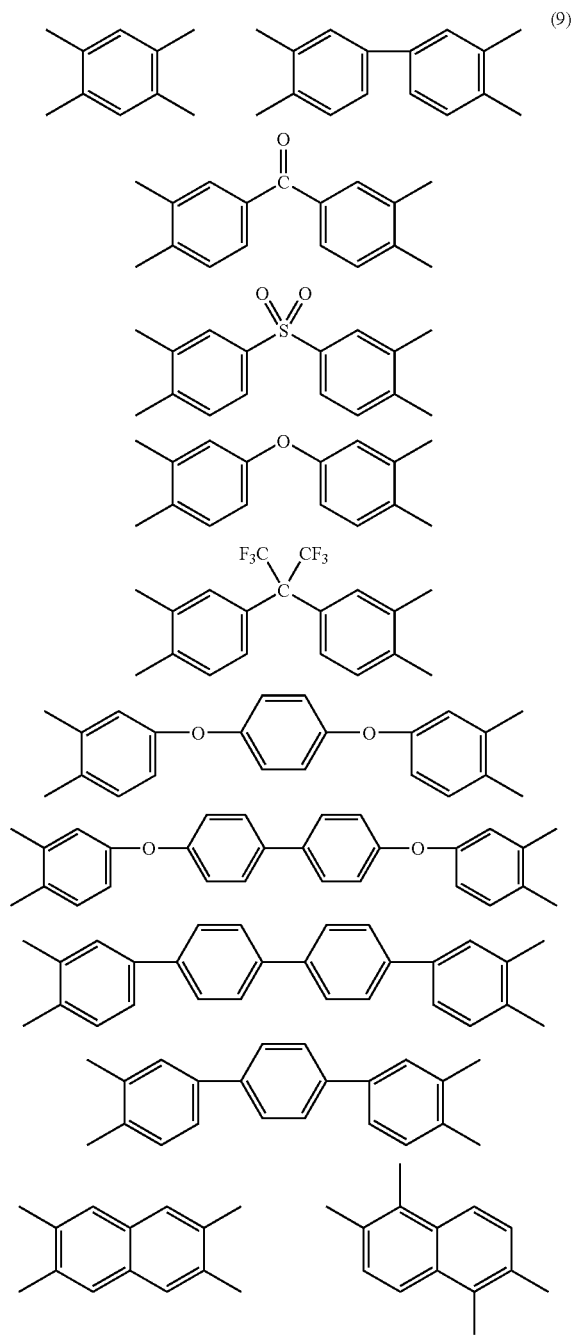

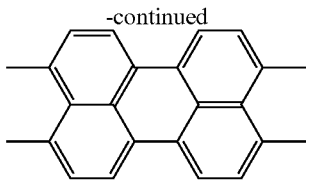

The polyimide-based resin B constituting the polyimide-based resin layer (B) includes a polyimide-based resin containing 80 mol % or more of a polyimide structural unit represented by the general formula (1). In the general formula (1), $R_1$ is a group represented by the formula (2) or (3), and $R_2$ is a group represented by the formula (4) or (5). In the formula (4), X shows $SO_2$, CO, or single bond.

This polyimide-based resin B is obtained by preferably reacting a diamino compound with a tetracarboxylic acid compound. In this case, the diamino compound that becomes a structural unit of the general formula (1), and the tetracarboxylic acid each can be used individually or in a combination of two or more kinds. It is advantageous to use two kinds in a molar ratio of 10:1–1:10 from the point of balance adjustment of various performances.

The diamino compound that generates the group represented by the formula (2) is preferably 1,3-bis(4-aminophenoxy)benzene (referred to as 1,3-BAB) or 1,4-bis(4-aminophenoxy)benzene (referred to as 1,4-BAB). The diamino compound that generates the group represented by the formula (3) is 2,2'-bis[4-(4-aminophenoxy)phenyl]propane (BAPP).

Further, the tetracarboxylic acid compound that generates the group represented by the formula (4) is preferably BPDA, 3,3',4,4'-diphenylsulfonetetracarboxylic dianhydride (DSDA), or 3,3',4,4'-benzophenonetetracarboxylic dianhydride (BTDA). The tetracarboxylic acid compound that generates the group represented by the formula (5) is PMDA.

The polyimide-based resin B may contain a unit other than the structural unit represented by the general formula (1), in a range of 20 mol % or less, and in this case, a conventional diamino compound or tetracarboxylic acid compound can appropriately be selected and used. A compound which is preferably selected and used is a diamino compound or a tetracarboxylic acid compound, having a group represented by the above-mentioned formula (8) or formula (9). Thus, by containing the structural unit other than the general formula (1), fine adjustment of various performances is possible according to choices of the kind of a conductor layer according to the purpose of use, settings of a thickness of an insulating resin layer, or variations of a production method for a laminate. The polyimide-based resin B is sufficient as long as it contains 80 mol % or more of the structural unit represented by the general formula (1), and may be a composition of the polyimide-based resin, as well as a copolymerized polyimide-based resin.

Synthesis of the polyimide-based resins A and B can employ the conventional method. Advantageously, there is a method of obtaining a polyimide-based resin by mixing a diamino compound and an acid dianhydride in an approximately equimolar proportion in a solvent, reacting at a reaction temperature in a range of 0–200° C., preferably 0–100° C., to obtain a precursor resin liquid of a polyimide-based resin, and then imidating the same. The solvent can list N-methylpyrrolidone (NMP), dimethylformamide (DMF), dimethylacetamide (DMAc), dimethylsulfoxide (DMSO), dimethylsulfate, sulfolane, butyrolactone, cresol, phenol, halogenated phenol, cyclohexanone, dioxane, tetrahydrofuran, diglyme, triglyme, and the like.

The conductor layer used in the laminate of the present invention can list metals selected from copper, aluminum, a stainless steel, iron, silver, palladium, nickel, chromium, molybdenum, tungsten, zirconium, gold, cobalt, titanium, tantalum, zinc, lead, tin, silicon, bismuth, indium or those alloys, and the like. A copper foil is preferable. A material suitable as a spring material for HDD suspensions is a stainless steel foil. Further, a conductor layer formed on an insulating resin layer including a film-like polyimide-based resin layer by sputtering treatment, plating treatment, or the like is advantageous. Besides, in the present invention, an organic conductor, a conductive paste and a conductive composite film may be used as the conductor layer.

Further, with respect to those conductors, for the purpose of improving an adhesive force or the like, the surfaces thereof may be subjected to sizing, chromium plating, nickel plating, chromium-nickel plating, copper-zinc alloy plating, copper oxide deposition, chemical surface treatment by aluminum alcholate, aluminum chelate, silane coupling agents, triazine thiols, benztriazoles, acetylene alcohols, acetylacetones, catechols, o-benzoquinones, tannins, xylinols or the like, or mechanical surface treatment such as surface layer roughening treatment.

The insulating resin layer in the laminate of the present invention is an embodiment that the polyimide-based resin layer is a mulilayered structure having at least two layers of the above-mentioned polyimide-based resin layer (A) and polyimide-based resin layer (B), and the structure is preferable that the polyimide-based resin layer (B) contacts with the conductor layer. Preferable embodiments of the laminate of the present invention are exemplified below. In the following exemplification, M means a conductor layer, PI(A) means a polyimide-based resin layer (A), and PI(B) means a polyimide-based resin layer (B).

1) M/PI(B)/PI(A)
2) M/PI(A)/PI(B)
3) M/PI(B)/PI(A)/M
4) M/PI(A)/PI(B)/PI(A)
5) M/PI(A)/PI(B)/PI(A)/M
6) M/PI(B)/PI(A)/PI(B)
7) M/PI(B)/PI(A)/PI(B)/M
8) M/PI(B)/PI(A)/PI(B)/PI(A)/PI(B)/M

A particularly preferable embodiment is that the insulating resin layer is a three-layered structure including PI(B)/PI(A)/PI(B), and has conductor layers on its both sides.

Note that, the laminate of the present invention may have a resin layer other than the polyimide-based resin layer (A) and polyimide-based resin layer (B), that is, other polyimide-based resin layers, in a range that does not impair the effect of the present invention. In this case, however, the thickness of the resin layer is 20% or less, preferably 10% or less, of the entire insulating resin layer. Further, the present invention does not substantially have a resin layer including a resin other than a polyimide-based resin, but slight use thereof is not excluded in a degree that does not impair the effect of the present invention.

In the laminate of the present invention, it is advantageous to make it possible to adjust a thickness constitution ratio of each of plural layers constituting the insulating resin layer, in order to finely adjust curl of the polyimide-based resin layer by a choice of the conductor layer or a setting of the thickness of the insulating resin layer according to the purpose of use, variations of a production method for the laminate, or the like. To reflect resin characteristics of the polyimide-based resin layer (A) to the laminate, a thickness ratio of the polyimide-based resin layer (A) to the polyimide-based resin layer (B) is 0.01 times or more, preferably 1 time or more. A more preferable thickness ratio is in a range of (A)/(B)=1.2–20. Here, when each layer includes plural layers, the thickness ratio is the value calculated from the total thickness.

The laminate of the present invention is excellent in heat resistance (hygroscopic solder heat resistant temperature) corresponding to a lead-free solder which will be explained in examples. The hygroscopic solder heat resistant temperature of the laminate is preferably 250° C. or higher, more preferably 260° C. or higher. A higher hygroscopic solder heat resistant temperature is desirable, but depending on the production method for the laminate, if the heat resistant temperature is high, there is a fear that processing conditions of contact-bonding under heat or the like in a laminating step or the like become strict. Therefore, in some cases, 400° C. or lower is desirable.

Production of the laminate of the present invention can be conducted by applying a polyimide precursor resin liquid to a substrate, followed by drying and heat treating, and can also be conducted by imidating the polyimide precursor resin liquid to form a polyimide-based resin liquid, and applying the same to a substrate, followed by drying and heat treating. In this case, a copper foil that is the conductor layer of the laminate may be used for the substrate, and a releasable substrate (film) that is not a conductor layer may be used. The polyimide-based resin layer formed by applying the polyimide precursor resin liquid or polyimide-based resin liquid to a substrate such as a conductor layer is dried, and in the case of the precursor resin layer, is further heat treated at 200° C. or higher, preferably 300° C. or higher, to conduct an imidation reaction. In the case of forming the resin layer in a multilayer, by repeating the procedure of applying plural resin liquids to a conductor layer followed by drying, or by simultaneously multilayer coating with a multilayer die or the like followed by drying, a polyimide-based resin layer having a multilayered structure can be formed on the conductor layer, similar to single layer formation. Further, a method enabling heat treatment finishing in a form of an insulating resin layer single film may be employed by using a casting belt, a casting roller or the like, and applying to the same.

In the case of directly applying a resin liquid to the conductor, it is advantageous in that the laminate of the present invention can be formed in the form as it is. On the other hand, in the case of applying a resin liquid to a releasable substrate, it is possible to form the laminate of the present invention in which the insulating resin layer has a multilayered structure, by laminating a polyimide or its precursor on a substrate in a liquid state, laminating a film of a polyimide-based precursor or a polyimide-based resin peeled after drying, in an optional method, contact-bonding the film under heat, and the like. Further, a conductor layer can be formed on the insulating resin layer formed of a film-like polyimide-based resin layer by sputtering treatment, plating treatment or the like, thereby forming the laminate of the present invention.

Application and heat treatment are mainly conducted by first applying a polyamic acid resin liquid to a substrate such as a conductor layer, drying a solvent, and then subjecting the substrate to heat treatment at a high temperature. However, if solubility in a solvent after imidation is satisfactory, it is possible to conduct the application in the state of a polyimide resin liquid obtained by heating a polyamic acid resin liquid to thereby proceed an imidation reaction in a solution. In such a case, the imidation reaction can be accelerated by adding amines such as picoline and lutidine, nitrogen-containing compounds such as pyridine and quinoline, acetic anhydride, or the like. Further, according to the need, additives such as fillers or silane coupling agents can be added to the polyimide-based precursor resin liquid or polyimide-based resin liquid.

The production method for the laminate of the present invention is not particularly limited, and the above-mentioned various modes are possible. A production method for the laminate of the present invention by coating, drying, and heat treatment curing, which is one of those modes, is described in detail.

To produce the laminate of the present invention, an optional coating method is possible. In the case of producing a laminate having a resin layer of plural layers, preferably the following three methods are desirable from the point of coating precision.

1) A method of simultaneously applying two kinds or more of polyimide-based resin liquids or polyimide-based precursor resin liquids to a conductor with a multilayer die.
2) To apply with an optional method, and then further apply to an undried coating surface with a knife coating.
3) To apply with an optional method, dry, and then further apply to a dried coating surface with an optional method.

The knife coating used herein is a method of applying a resin liquid by uniformly spreading the same with a bar, a squeegee, a knife or the like.

An optional method is possible as the dry curing method. However, generally employed is a method of applying a polyimide-based resin liquid or a polyimide-based precursor resin liquid, and allowing a laminate containing a pre-dried, uncured polyimide precursor resin liquid to stand in a hot air drying oven that can be set at a given temperature, for a given length of time, or conducting a heat treatment at a high temperature (200° C. or higher) by continuously moving the laminate within the drying oven area, thereby securing a given dry curing time. Further, considering working effectiveness, gain or the like, a batch treatment method is possible, which includes applying a polyimide-based resin liquid or a polyimide-based precursor resin liquid, winding up a pre-dried, uncured laminate in a roll form, and then conducting dry curing at a high temperature. In this batch treatment method, it is preferable to conduct the heat treatment at a high temperature (200° C. or higher) under a reduced pressure, a reducing gas atmosphere, or a reducing gas atmosphere/reduced pressure in order to prevent oxidation of the conductor.

The laminate of the present invention can be formed to have a structure of a double-sided laminate having conductor layers on both sides of the resin layer. The structure of a double-sided laminate having conductor layers on both sides can be produced by first applying a polyimide-based precursor resin liquid or a polyimide-based resin liquid to a conductor, dry curing, and then contact-bonding a conductor layer thereon under heat. As a heat press method in this case, general hydropress, vacuum type hydropress, autoclave pressure type vacuum press, a continuous heat laminator or the like can be used. Of those, the vacuum hydropress is a preferable heat press method because a sufficient press pressure is obtained, removal of a residual volatile content is easy, and oxidation of a conductor such as a metal foil can be prevented.

Heat press temperature at this contact-bonding under heat is not particularly limited, but temperature higher than the glass transition temperature of the polyamide-based resin used is desirable. Further, a heat press pressure depends on the kind of a press device used, but 0.1–50 MPa (1–500 kg/cm$^2$) is appropriate.

In the case of conducting heat press with hydropress, it is possible to obtain a multilayered laminate with one heat press by: providing a single-sided conductor polyimide-based resin laminate obtained as mentioned above and a conductor layer, processed in a sheet form, respectively; laminating those in plural layers; and simultaneously contact bonding with a heat press under heat and pressure for lamination.

BEST MODE FOR CARRYING OUT THE INVENTION

Evaluations of heat resistance corresponding to a lead-free solder (hygroscopic solder heat resistant test) and volume resistivity in examples are made according to the following method.

(Hygroscopic Solder Heat Resistant Test)

Commercially available photoresist films are laminated on a laminate constituted of a conductor/a resin layer/the conductor, followed by exposure (365 nm, exposure amount: about 500 J/m$^2$) with masks for given pattern formation, and resist layers are cured and formed into the same pattern in which a copper foil layer has a round shape having a diameter of 1 mm on each side of the laminate. Next, a cured resist portion is developed (developer: 1% NaOH aqueous solution), a copper foil layer which is unnecessary for given pattern formation is removed by etching using a ferric chloride aqueous solution, and a cured resist layer is peeled and removed with an alkali liquid, thereby obtaining a sample having formed a pattern for the evaluation of heat resistance corresponding to a lead-free solder (a laminate after forming conductor layers of a laminate constituted of the conductor/an insulating resin layer/the conductor into the same pattern of a round shape having a diameter of 1 mm).

1) A sample is allowed to stand under a 105° C. environment for 1.5 hr, and further allowed to stand under a 40° C./90% RH (relative humidity) environment for 8 days. The sample is immersed in a molten solder bath having different temperatures for 10 sec. Temperatures that do not cause deformation or swelling on a conductor layer pattern portion are measured, and the maximum temperature out of the measured temperatures is defined as a solder heat resistant temperature.
2) A sample is allowed to stand under a 40° C./90% RH environment for 192 hr, and immersed in a molten solder bath having different temperatures for 10 sec. The presence or absence of a deformation or swelling phenomenon is observed on a copper foil layer portion. The maximum temperature of the solder bath which does not cause deformation or swelling on a copper foil layer portion is defined as a heat resistant temperature.

The above tests 1) and 2) are collectively defined as a hygroscopic solder heat resistant test.

(Evaluation of Volume Resistivity)

A sample is obtained in the same manner as described above so as to have a given pattern (according to IPC-TM-650,2.5.17) suitable for measuring volume resistivity. An alkali component is washed with water, and deposition water on a sample surface is volatilized with a drier at 90° C.

1) Measurement of volume resistivity is conducted after allowing the sample to stand for 24 hr under a thermostatic and humidistatic environment (23±3° C., 50±5% RH).
2) The volume resistivity is measured under conditions of an applied voltage of 500 V and an applied time of 60 sec using an electric resistance measuring device (manufactured by Advantest Corporation, Model R8340A).

Further, abbreviations used in the following examples are as follows.
MABA: 4,4'-diamino-2'-methoxybenzanilide
DAPE: 4,4'-diaminodiphenyl ether
1,3-BAB: 1,3-bis(4-aminophenoxy)benzene
1,4-BAB: 1,4-bis(4-aminophenoxy)benzene
BAPP: 2,2'-bis[4-(4-aminophenoxy)phenyl]propane
DADMB: 4,4'-diamino-2,2'-dimethylbiphenyl PMDA: pyromellitic anhydride
BPDA: 3,3',4,4'-biphenyltetracarboxylic dianhydride
BTDA: 3,3',4,4'-benzophenonetetracarboxylic dianhydride
DSDA: 3,3',4,4'-diphenylsulfonetetracarboxylic dianhydride
DMAc: N,N-dimethylacetamide

SYNTHESIS EXAMPLE 1

65.02 g (0.306 mol) of DADMB and 40.88 g (0.204 mol) of DAPE were dissolved in 1.28 kg of DMAc in a 1.3 L vessel while the mixture was being stirred. Next, 29.58 g (0.101 mol) of BPDA and 87.73 g (0.402 mol) of PMDA were added to the mixture. After that, stirring was continued for about 3 hr to conduct a polymerization reaction, and a polyimide precursor resin liquid a having an apparent viscosity, measured with an E-type viscometer, of 150 poise (29° C.) was obtained.

SYNTHESIS EXAMPLE 2

22.13 g (0.076 mol) of 1,3-BAB was dissolved in 255 g of DMAc. Next, the solution was cooled down to 5–10° C., and 16.71 g (0.047 mol) of DSDA and 6.78 g (0.031 mol) of PMDA were added to the solution. After that, stirring was continued for about 1 hr to conduct a polymerization reaction, and a polyimide precursor resin liquid b with a viscosity of 26.4 poise (25° C.) was obtained.

SYNTHESIS EXAMPLE 3

29.13 g (0.071 mol) of BAPP was dissolved in 294 g of DMAc. Next, 3.225 g (0.011 mol) of BPDA and 13.55 g (0.062 mol) of PMDA were added to the solution. After that, stirring was continued for about 3 hr to conduct a polymerization reaction, and a polyimide precursor resin liquid c with a viscosity of 35 poise (25° C.) was obtained.

SYNTHESIS EXAMPLE 4

30.99 g (0.076 mol) of BAPP was dissolved in 302 g of DMAc. Next, 16.96 g (0.078 mol) of PMDA was added to the solution. After that, stirring was continued for about 2 hr to conduct a polymerization reaction, and a polyimide precursor resin liquid d with a viscosity of 35 poise (25° C.) was obtained.

SYNTHESIS EXAMPLE 5

25.50 g (0.087 mol) of 1,3-BAB was dissolved in 346 g of DMAc. Next, 28.50 g (0.089 mol) of BTDA was added to the solution. After that, stirring was continued for about 2.5 hr to conduct a polymerization reaction, and a polyimide precursor resin liquid e with a viscosity of 40 poise (25° C.) was obtained.

SYNTHESIS EXAMPLE 6

26.38 g (0.090 mol) of 1,4-BAB was dissolved in 437 g of DMAc. Next, 27.62 g (0.094 mol) of BPDA was added to the solution. After that, stirring was continued for about 3 hr to conduct a polymerization reaction, and a polyimide precursor resin liquid f with a viscosity of 34 poise (25° C.) was obtained.

SYNTHESIS EXAMPLE 7

66.51 g (0.259 mol) of MABA and 34.51 g (0.172 mol) of DAPE were dissolved in 1.11 kg of DMAc. After the solution was cooled down to 5–10° C., 92.62 g (0.425 mol) of PMDA was added to the solution. After that, stirring was continued for about 1.5 hr to conduct a polymerization reaction, and a polyimide precursor resin liquid g with a viscosity of 240 poise (29° C.) was obtained.

SYNTHESIS EXAMPLE 8

26.83 g (0.134 mol) of DAPE was dissolved in 630 g of DMAc. After the solution was cooled down to 5–10° C., 42.96 g (0.133 mol) of BTDA was added to the solution. After that, stirring was continued for about 2 hr to conduct a polymerization reaction, and a polyimide precursor resin liquid h with a viscosity of 17.6 poise (25° C.) was obtained.

SYNTHESIS EXAMPLE 9

203.22 g (0.957 mol) of DADMB and 31.10 g (0.106 mol) of 1,3-BAB were dissolved in 3.076 kg of DMAc. Next, 61.96 g (0.211 mol) of BPDA and 183.73 g (0.842 mol) of PMDA were added to the solution. After that, stirring was continued for about 4 hr to conduct a polymerization reaction, and a polyimide precursor resin liquid i with a viscosity of 250 poise (25° C.) was obtained.

SYNTHESIS EXAMPLE 10

283.91 g (0.692 mol) of BAPP was dissolved in 2.958 kg of DMAC. Next, 10.48 g (0.036 mol) of BPDA and 147.61 g (0.677 mol) of PMDA were added to the solution. After that, stirring was continued for about 3 hr to conduct a polymerization reaction, and a polyimide precursor resin liquid j with a viscosity of 40 poise (25° C.) was obtained.

EXAMPLE 1

As the copper foil, a copper foil manufactured by Nikko Materials Co., Ltd. (BHY-22B-T, 18 μm in thickness; hereinafter a copper foil simply refers to this copper foil) was used. The polyimide precursor resin liquid b prepared in Synthesis Example 2 was uniformly applied to this copper foil to have a thickness of 34 μm, and the whole was heat-dried at 130° C. to remove a solvent. Next, the polyimide precursor resin liquid a prepared in Synthesis Example 1 was uniformly applied to have a thickness of 190 μm so as to be laminated thereon, and the whole was heat-dried at 90–125° C. to remove a solvent. Further, the polyimide precursor resin liquid b prepared in Synthesis Example 2 was uniformly applied to the layer of the polyimide precursor a to have a thickness of 38 μm, and the whole was heat-dried at 135° C. to remove a solvent. After that, heat treatment was conducted on the resultant product-starting from room temperature to 280° C. over about 4 hr to perform imidation, thereby obtaining a laminate 1 having an insulating resin layer with a total thickness of about 25 μm (thickness precision ±10%, thickness precision of resin layer of laminates in the below-mentioned examples is the same) formed of a three-layered polyimide-based resin layer, formed on the copper foil.

Thicknesses after curing of the polyimide precursor resin liquids b/a/b applied to the copper foil are about 3.5 μm/about 19 μm/about 4 μm, respectively, in order.

EXAMPLE 2

A laminate 2 having an insulating resin layer having a total thickness of about 25 μm formed of a three-layered polyimide-based resin layer, formed on a copper foil was obtained in the same manner as in Example 1.

The kinds and thicknesses after curing of the polyimide precursor resin liquids applied to the copper foil are respectively the polyimide precursor resin liquid c, about 3.5 μm/the polyimide precursor resin liquid a, about 19 μm/the polyimide precursor resin liquid c, about 4 μm in order.

EXAMPLE 3

A laminate 3 having an insulating resin layer having a total thickness of about 25 μm formed of a three-layered polyimide-based resin layer, formed on a copper foil was obtained in the same manner as in Example 1.

The kinds and thicknesses after curing of the polyimide precursor resin liquids applied to the copper foil are respectively the polyimide precursor resin liquid d, about 3.5 μm/the polyimide precursor resin liquid a, about 19 μm/the polyimide precursor resin liquid d, about 4 μm in order.

EXAMPLE 4

A laminate 4 having an insulating resin layer having a total thickness of about 25 μm formed of a three-layered polyimide-based resin layer, formed on a copper foil was obtained in the same manner as in Example 1.

The kinds and thicknesses after curing of the polyimide precursor resin liquids applied to the copper foil are respectively the polyimide precursor resin liquid e, about 3.5 μm/the polyimide precursor resin liquid a, about 19 μm/the polyimide precursor resin liquid e, about 4 μm in order.

EXAMPLE 5

A laminate 5 having an insulating resin layer having a total thickness of about 25 μm formed of a three-layered polyimide-based resin layer, formed on a copper foil was obtained in the same manner as in Example 1.

The kinds and thicknesses after curing of the polyimide precursor resin liquids applied to the copper foil are respectively the polyimide precursor resin liquid f, about 3.5 μm/the polyimide precursor resin liquid a, about 19 μm/the polyimide precursor resin liquid f, about 4 μm in order.

EXAMPLE 6

As the copper foil, a copper foil manufactured by Mitsui Mining & Smelting Co., Ltd. (SQ-VLP, 12 μm in thickness; hereinafter this copper foil is referred to as copper foil SQ) was used. A laminate 6 having an insulating resin layer having a total thickness of about 13 μm formed of a three-layered polyimide-based resin layer, formed on the copper foil was obtained in the same manner as in Example 1.

The kinds and thicknesses after curing of the polyimide precursor resin liquids applied to the copper foil are respectively the polyimide precursor resin liquid j, about 2.5 μm/the polyimide precursor resin liquid i, about 8 μm/the polyimide precursor resin liquid j, about 3.5 μm in order.

The laminates 1–6 obtained in Examples 1–6 above each have a layer structure of the copper foil/a polyimide-based resin layer (B)/a polyimide-based resin layer (A)/the polyimide-based resin layer (B)

COMPARATIVE EXAMPLE 1

A laminate 7 having an insulating resin layer having a total thickness of about 25 μm formed of a three-layered polyimide-based resin layer, formed on a copper foil was obtained in the same manner as in Example 1.

The kinds and thicknesses after curing of the polyimide precursor resin liquids applied to the copper foil are respectively the polyimide precursor resin liquid h, about 4 μm/the polyimide precursor resin liquid g, about 19 μm/the polyimide precursor resin liquid b, about 3.5 μm in order.

EXAMPLE 7

Using the laminate 1 obtained in Example 1 above, a copper foil was overlapped so as to contact with the polyimide resin layer side of the laminate, and was contact-bonded under heat to produce a double-sided copper foil laminate. Similarly, using the laminates 2–6 obtained in Examples 2–6, double-sided copper foil laminates were prepared, respectively. Further, similarly, using the laminate 7 obtained in Comparative Example 1, a double-sided copper foil laminate was produced. In the production of a double-sided copper foil laminate using the laminate 6, the copper foil SQ was used. A hygroscopic solder heat resistant test and an evaluation of volume resistivity were made on the 7 kinds of the double-sided copper foil laminates. The kinds of the laminates used in double-sided copper foil laminates and the results of the test and the evaluation are shown in Table 1.

TABLE 1

| Laminate | Hygroscopic solder heat resistant temperature [° C.] | Volume resistivity [Ω · m] |
| --- | --- | --- |
| 1 | 270 | $4.70 \times 10^{15}$ |
| 2 | 270 | $4.23 \times 10^{15}$ |
| 3 | 270 | $4.65 \times 10^{15}$ |
| 4 | 260 | $4.40 \times 10^{15}$ |
| 5 | 270 | $2.70 \times 10^{15}$ |
| 6 | 300 | $2.30 \times 10^{14}$ |
| 7 | 220 | $7.50 \times 10^{11}$ |

INDUSTRIAL APPLICABILITY

A laminate excellent in heat resistance after moisture absorption required in a lead-free solder joint can be provided. Such a laminate is excellent in various characteristics required in wiring boards or the like, including heat resistance, and is therefore useful for use in flexible printed wiring boards or as a laminate for HDD suspensions.

What is claimed is:

1. A laminate comprising a conductor layer and an insulating resin layer that is formed of plural polyimide-based resin layers,
    wherein the insulating resin layer has at least two layers:
    (1) a polyimide-based resin layer (A) obtained by reacting a diamine compound containing 40 mol % or more of 4,4'-diamino-2,2'-dimethylbiphenyl with a tetracarboxylic acid compound; and (2) a polyimide-based resin layer (B) containing 80 mol % or more of a polyimide structural unit represented by the following general formula (1):

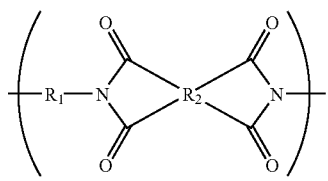

wherein, in formula (1), $R_1$ is at least one kind of group selected from the group consisting of groups represented by the following formulae (2),

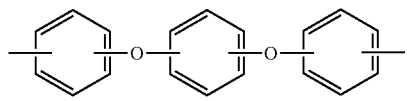

and groups represented by the following formulae (3)

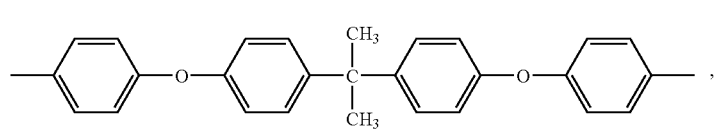

$R_2$ is at least one kind of group selected from group consisting of groups represented by the following formulae (4),

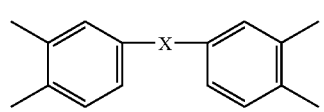

and groups represented by the following formulae (5)

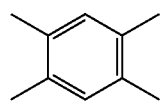

wherein, in formula (4), X shows at least one kind selected from the group consisting of $SO_2$, CO, and single bond, and wherein the polyimide-based resin layer (B) is in contact with the conductor layer.

2. A laminate according to claim 1, wherein the insulating resin layer comprises a three-layered structure having the polyimide-based resin layer (B), the polyimide-based resin layer (A) and the polyimide-based resin layer (B) that are laminated successively.

3. A laminate according to claim 1, wherein the polyimide-based resin layer (A) comprises a polyimide-based resin containing 40 mol % or more of at least one structural unit selected from the group consisting of structural unit represented by the following formulae (6):

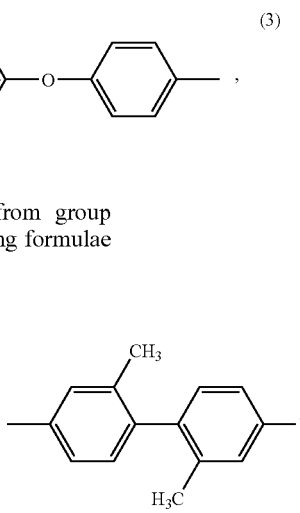

and structural unit represented by the following formulae (7):

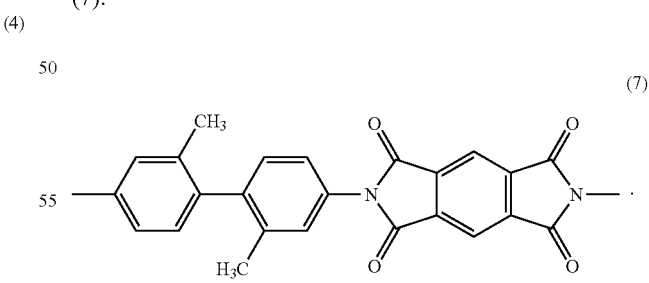

4. A laminate according to claim 1, wherein the insulating resin layer has, on both sides thereof, conductor layers.

5. A laminate according to claim 1, wherein the insulating resin layer comprises a two-layered structure having the polyimide-based resin layer (B) and the polyimide-based resin layer (A) that are laminated successively.

6. A laminate according to claim 1, wherein the insulating resin layer comprises a three-layered structure having the polyimide-based resin layer (B), the polyimide-based resin layer (A) and the polyimide-based resin layer (B) that are laminated successively.

7. A laminate according to claim 1, wherein the insulating resin layer consists of the polyimide-based resin layer (A) and the polyimide-based resin layer (B).

* * * * *